（12） United States Patent
Kim et al.

(10) Patent No.: US 11,013,154 B2
(45) Date of Patent: May 18, 2021

(54) DISPLAY DEVICE

(71) Applicant: LG Display Co., Ltd., Seoul (KR)

(72) Inventors: Misook Kim, Paju-si (KR); Daeyoung Jung, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 16/706,417

(22) Filed: Dec. 6, 2019

(65) Prior Publication Data

US 2020/0196492 A1 Jun. 18, 2020

(30) Foreign Application Priority Data

Dec. 18, 2018 (KR) ........................ 10-2018-0164396

(51) Int. Cl.
| | |
|---|---|
| *H05K 7/20* | (2006.01) |
| *H05K 1/14* | (2006.01) |
| *H05K 5/00* | (2006.01) |
| *H05K 5/03* | (2006.01) |
| *G02F 1/1333* | (2006.01) |
| *H01L 51/52* | (2006.01) |

(52) U.S. Cl.
CPC ... *H05K 7/20963* (2013.01); *G02F 1/133308* (2013.01); *G02F 1/133385* (2013.01); *H01L 51/529* (2013.01); *H01L 51/5237* (2013.01); *H05K 1/147* (2013.01); *H05K 5/0017* (2013.01); *H05K 5/03* (2013.01); *H05K 7/20436* (2013.01); *G02F 1/133314* (2021.01); *H05K 2201/10128* (2013.01); *H05K 2201/10136* (2013.01)

(58) Field of Classification Search
CPC .......... H05K 7/20963; H05K 51/5237; H05K 1/147; H05K 5/0017; H05K 5/03; H05K 7/20436; H05K 2201/10128; H05K 2201/10136; H05K 7/2096; H05K 1/189; H05K 7/20972; H05K 1/028; H05K 1/0203; H05K 7/2039; H05K 7/20954; H05K 2201/09145; G02F 1/133308; G02F 1/133385; G02F 1/133314; G02F 1/13452; G02F 2201/36; G02F 2202/28; G02F 1/1601; H01L 51/5237; G06F 1/1601
USPC ...... 361/702, 704, 679.12, 710; 349/58, 161
See application file for complete search history.

(56) References Cited

U.S. PATENT DOCUMENTS

2005/0088092 A1\* 4/2005 Kim .................... H05K 7/20963
313/582

\* cited by examiner

*Primary Examiner* — Mandeep S Buttar
(74) *Attorney, Agent, or Firm* — Fenwick & West LLP

(57) ABSTRACT

Circuit films, a printed circuit board (PCB), and the like, are connected to a display panel. First and second heat dissipation members are coupled to a rear surface of the display panel to support and protect the circuit films, the PCB, and the like, while dissipating heat from driver ICs and the like.

15 Claims, 10 Drawing Sheets

FIG.10

| Items | Temperature of Front Surface of Display Panel | |
| --- | --- | --- |
| | TEST1 | TEST2 |
| IR Image | | |
| Max T. [℃] | 52.7 | 43.3 |
| Min T. [℃] | 37.0 | 32.0 |
| Avg. T [℃] (9Point) | 42.2 | 34.8 |

DISPLAY DEVICE

CROSS REFERENCE TO RELATED APPLICATION

This application claims priority to Republic of Korea Patent Application No. 10-2018-0164396, filed on Dec. 18, 2018, which is hereby incorporated by reference in its entirety.

BACKGROUND

Field

Exemplary embodiments relate to a display device and, more particularly, to a display device having a structure able to facilitate detachment and attachment of a printed circuit board (PCB) during assembly and disassembly while firmly supporting the PCB and a plurality of circuit films. The structure of the display device can safely protect the PCB, the circuit films, and the like, and improve heat dissipation performance for dissipating heat from driver integrated circuits (ICs) and the like, thereby improving the image quality and durability of the display panel.

Description of Related Art

In general, research into flat panel display devices, such as liquid crystal display (LCD) devices, plasma display panel (PDP) devices, field emission display (FED) devices, and organic light-emitting diode (OLED) display devices, has been actively undertaken. Among such flat panel display devices, LCD devices and OLED display devices have recently come to prominence, due to advantages thereof, such as adaptability to mass production, easy implementation of driving units, as well as the ability thereof to realize high resolution.

However, in such display devices of the related art, heat generated by integrated circuits (ICs) mounted on a circuit film or a printed circuit board (PCB) may degrade the image quality of a display panel and deteriorate the durability of the display panel and a variety of components.

In particular, recently, research into the development of a display device able to protect a circuit film, a PCB, or the like, disposed within the display device, while improving heat dissipation performance, has increasingly been required.

SUMMARY

Various aspects of the present disclosure provide a display device having a structure able to facilitate detachment and attachment of a printed circuit board (PCB) during assembly and disassembly, while firmly supporting the PCB and a circuit film.

Also provided is a display device having a structure able to protect circuit films, PCBs, and the like, arranged on a circuit section connected to a display panel, and to improve heat dissipation performance for dissipating heat from driver integrated circuits (ICs) and the like, thereby improving the image quality and durability of the display panel.

The object of the present disclosure is not limited to the aforementioned description, and other objects not explicitly disclosed herein will be clearly understood by a person having ordinary skill in the art to which the present disclosure pertains from the description provided hereinafter.

According to an aspect of the present disclosure, a display device may include first and second heat dissipation members coupled to a rear surface of a display panel to support and protect circuit films, a PCB, and the like, connected to the display panel, while dissipating heat from driver ICs and the like, as well as from the circuit films, the PCB, and the like.

According to embodiments, the display device has a structure able to advantageously facilitate detachment and attachment of a PCB during assembly and disassembly while firmly supporting the PCB and circuit films.

According to embodiments, the display device also has a structure able to advantageously protect circuit films, PCBs, and the like, connected to the display panel, and to improve heat dissipation performance for dissipating heat from the driver ICs and the like, thereby improving the image quality and durability of the display panel.

BRIEF DESCRIPTION OF THE DRAWINGS

The above and other objects, features, and advantages of the present disclosure will be more clearly understood from the following detailed description, taken in conjunction with the accompanying drawings, in which:

FIG. 10 is a diagram illustrating changes in temperature of a display panel of the display device according to embodiments.

DETAILED DESCRIPTION

Figure 1:
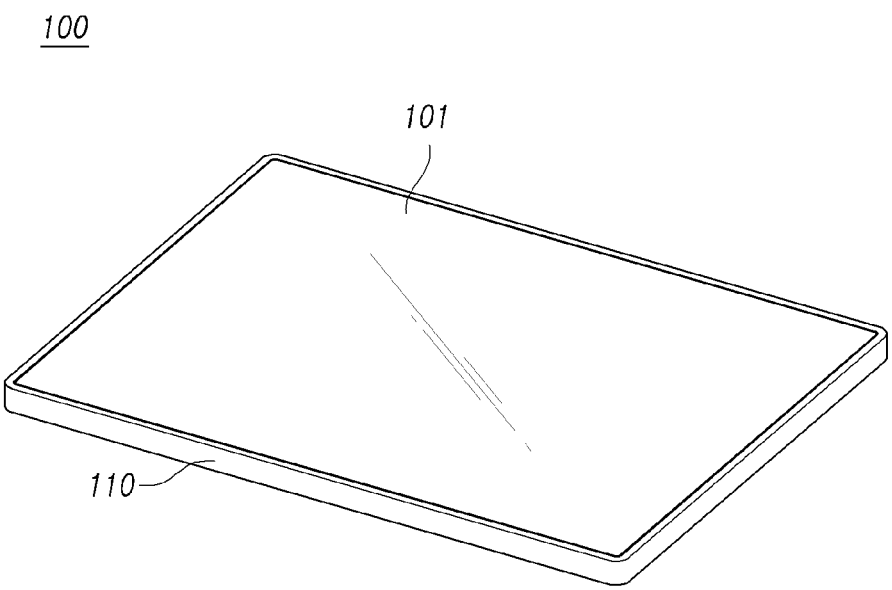
FIG. 1 is a perspective view illustrating a display device according to embodiments.

Hereinafter, reference will be made to embodiments of the present disclosure in detail, examples of which are illustrated in the accompanying drawings. Throughout this document, reference should be made to the drawings, in which the same reference numerals and symbols will be used to designate the same or like components. In the following description of the present disclosure, detailed descriptions of known functions and components incorporated into the present disclosure will be omitted in the case that the subject matter of the present disclosure may be rendered unclear thereby.

It will also be understood that, while terms, such as "first," "second," "A," "B," "(a)," and "(b)," may be used herein to describe various elements, such terms are merely used to distinguish one element from other elements. The substance, sequence, order, or number of such elements is not limited by these terms. It will be understood that when an element is referred to as being "connected," "coupled," or "linked" to another element, not only can it be "directly connected, coupled, or linked" to the other element, but it can also be "indirectly connected, coupled, or linked" to the other element via an "intervening" element.

Figure 2:
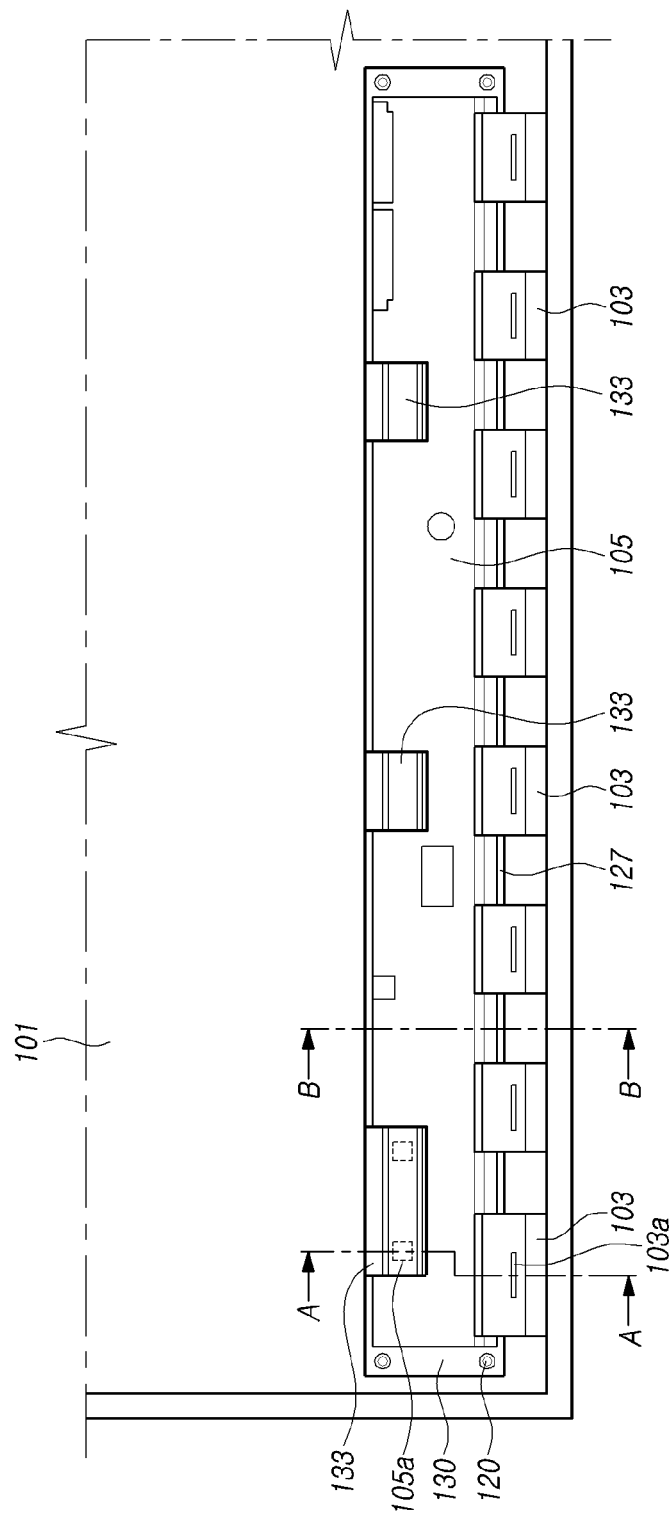
FIG. 2 is a rear view illustrating a portion of the display device according to embodiments.
Figure 3:
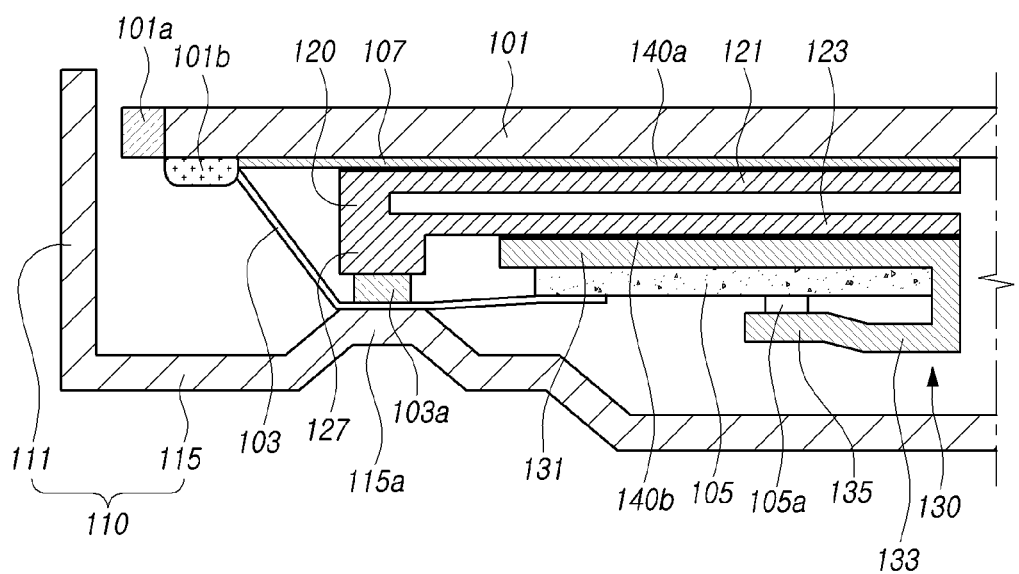
FIG. 3 is a cross-sectional view taken along line A-A of FIG. 2 according to one embodiment.
Figure 4:
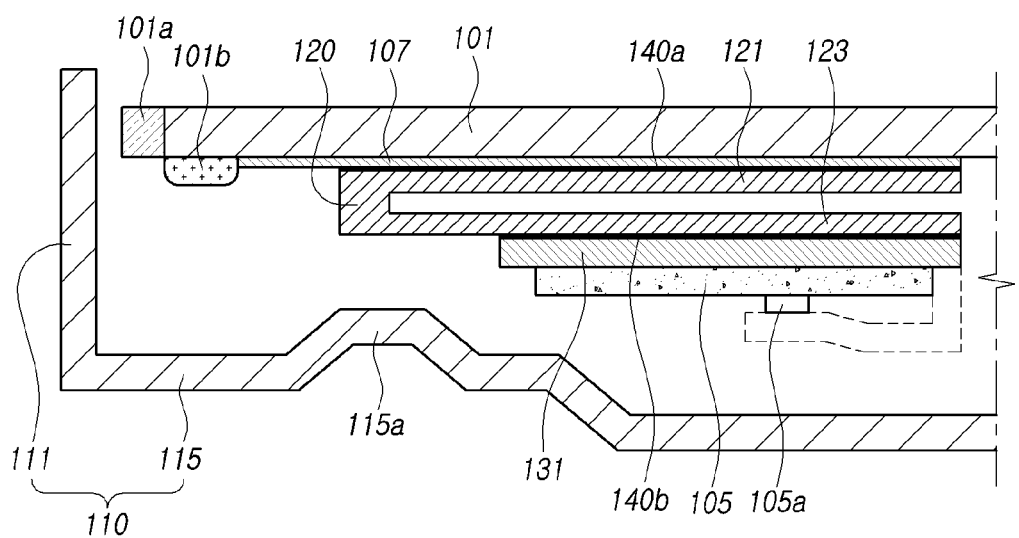
FIG. 4 is a cross-sectional view taken along line B-B of FIG. 2 according to one embodiment.
Figure 5:
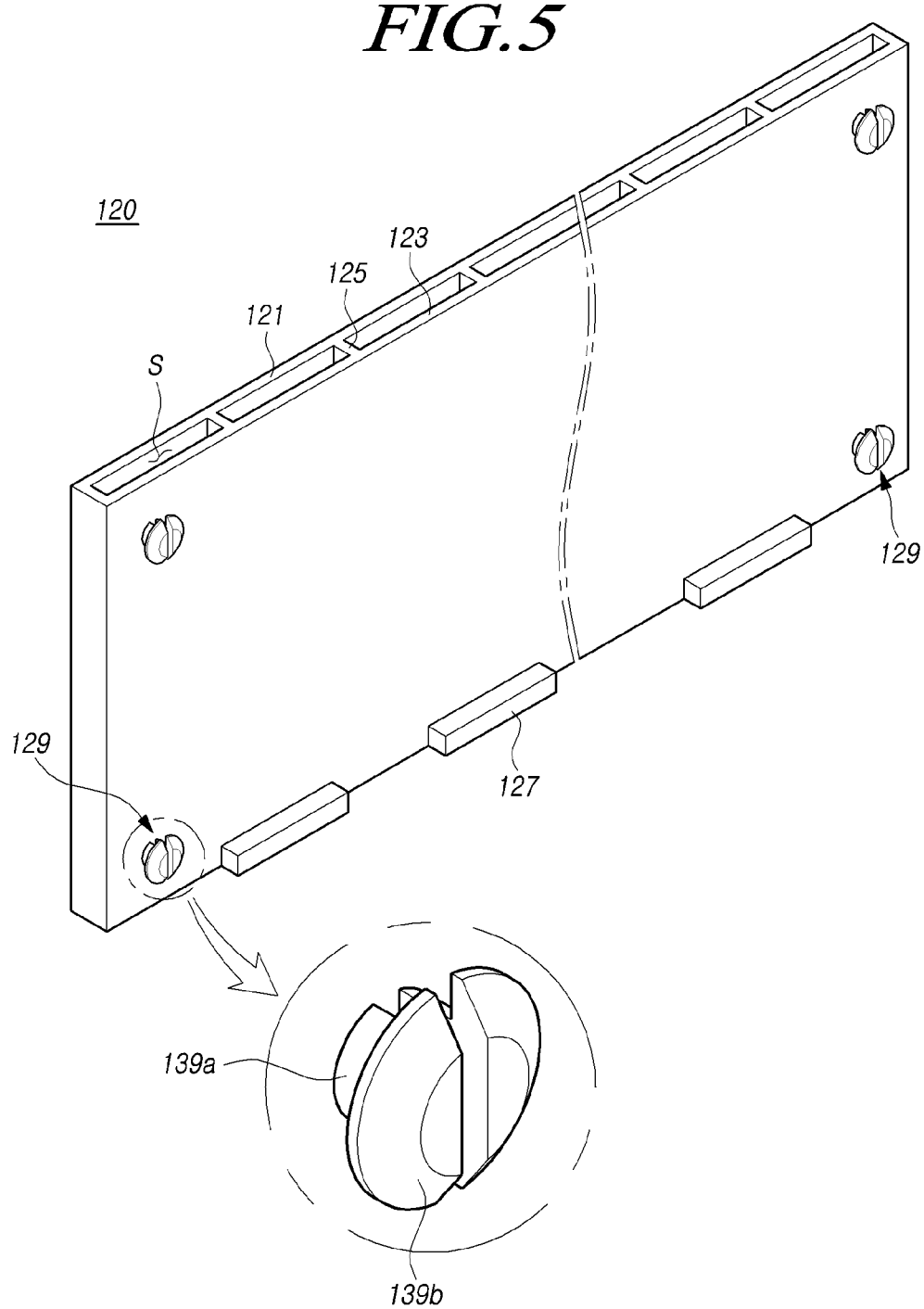
FIGS. 5 and 6 are perspective views respectively illustrating a portion of the display device according to embodiments.
Figure 6:
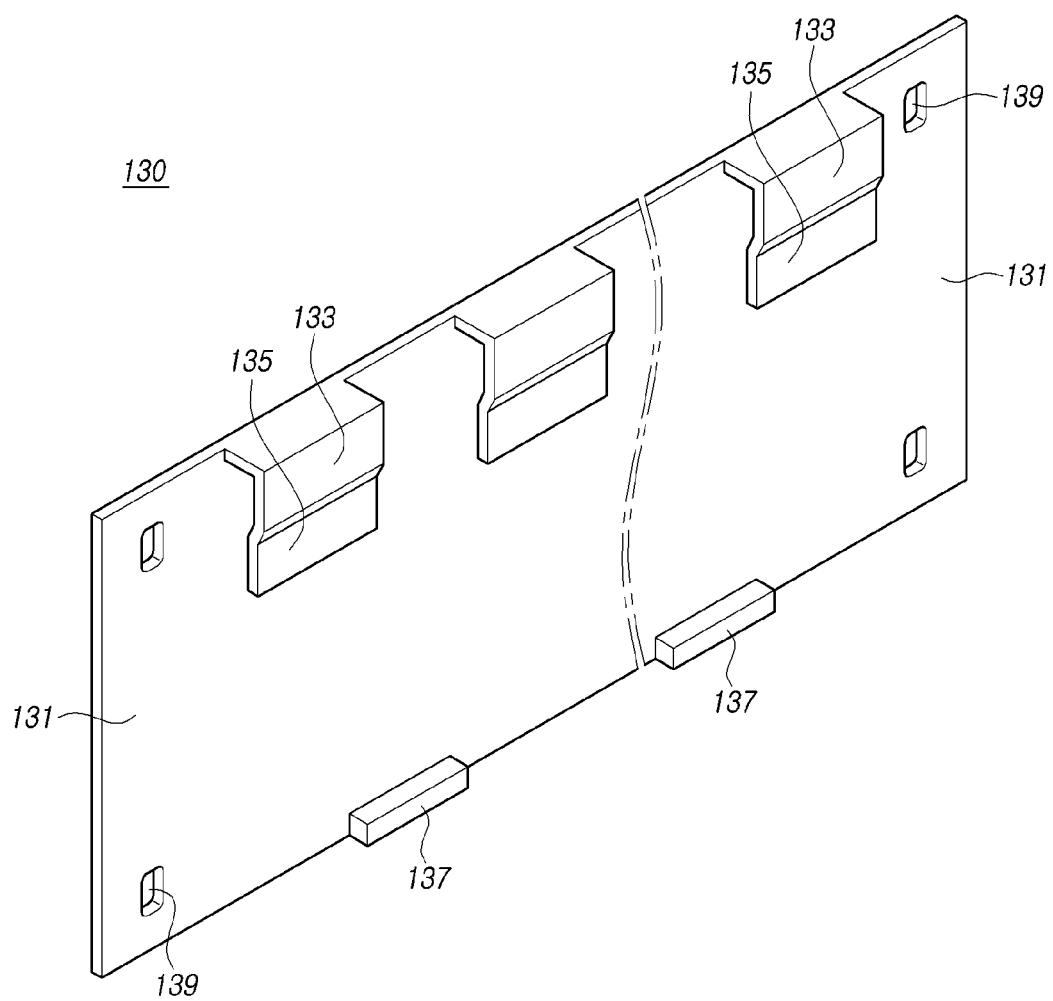
Figure 7:
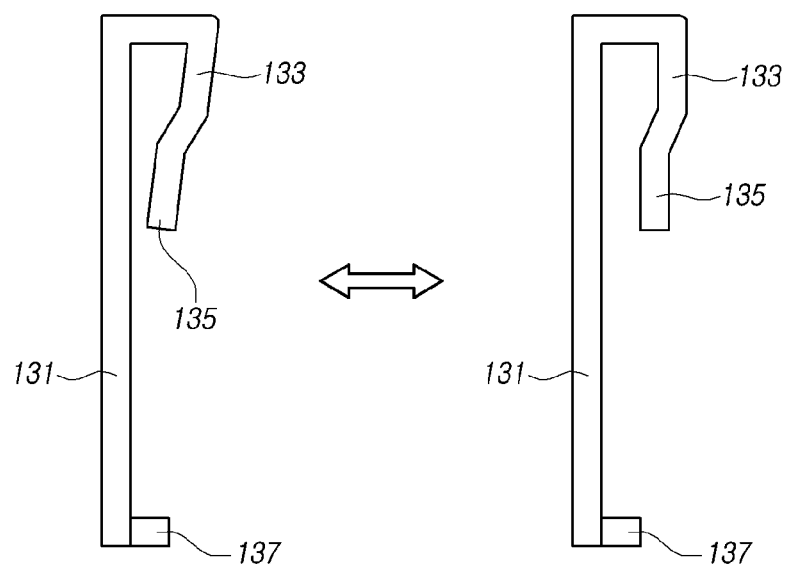
FIG. 7 is a side view illustrating a portion of the display device according to embodiments.
Figure 8:
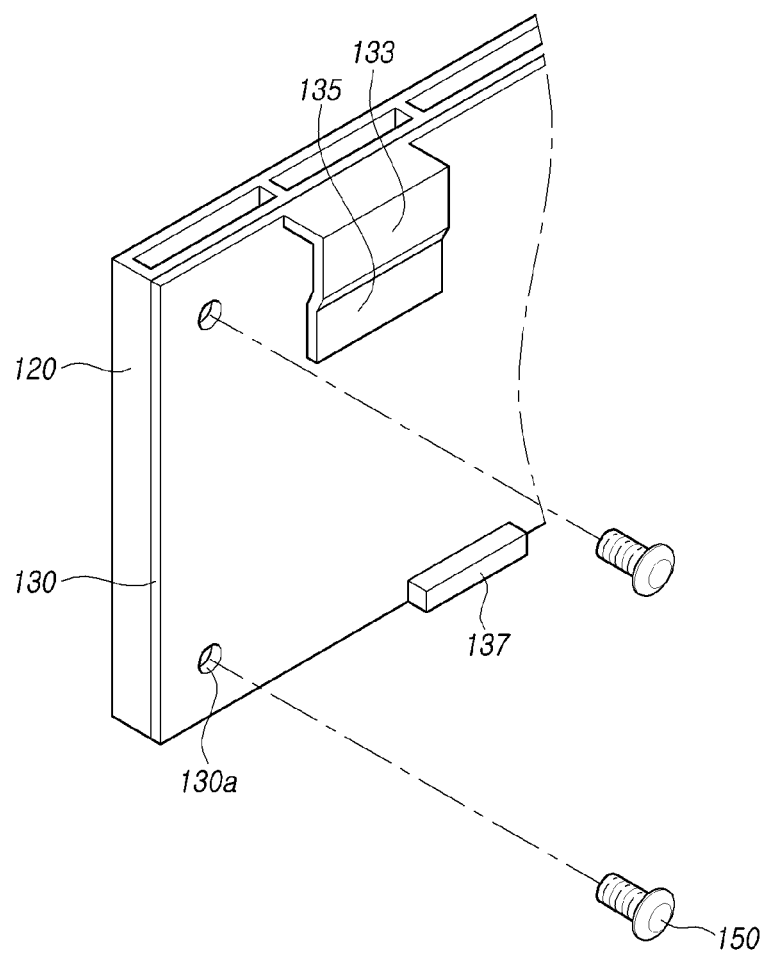
FIG. 8 is a perspective view illustrating a portion of the display device according to embodiments.
Figure 9:
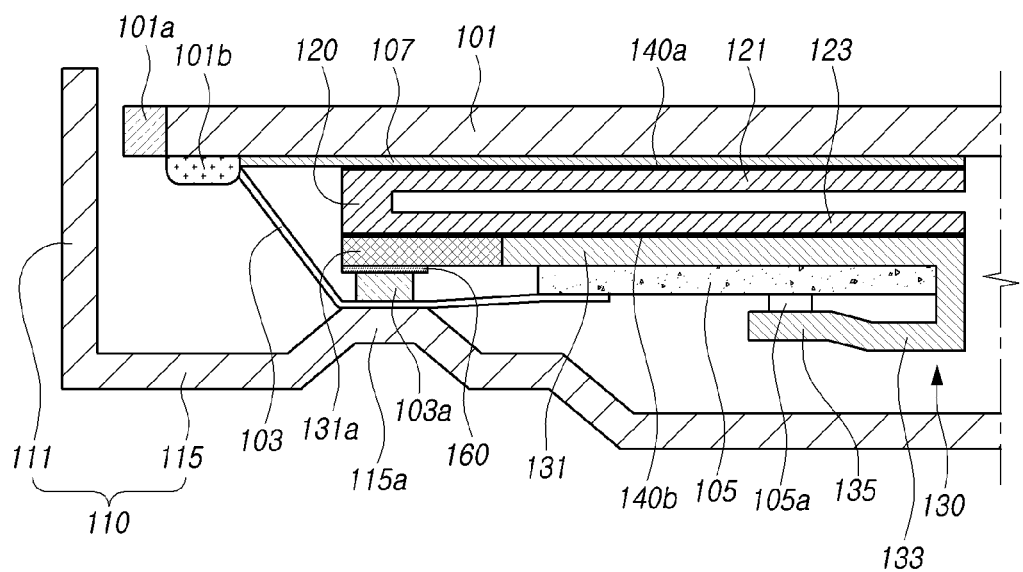
FIG. 9 is a cross-sectional view illustrating a modified embodiment of FIG. 3.

FIG. 1 is a perspective view illustrating a display device according to embodiments; FIG. 2 is a rear view illustrating a portion of the display device according to embodiments; FIG. 3 is a cross-sectional view taken along line A-A of FIG. 2; FIG. 4 is a cross-sectional view taken along line B-B of FIG. 2; FIGS. 5 and 6 are perspective views respectively illustrating a portion of the display device according to embodiments; FIG. 7 is a side view illustrating a portion of the display device according to embodiments; FIG. 8 is a perspective view illustrating a portion of the display device according to embodiments; FIG. 9 is a cross-sectional view illustrating a modified embodiment of FIG. 3; and FIG. 10 is a diagram illustrating changes in temperature of a display panel of the display device according to embodiments.

As illustrated in the drawings, the display device 100 according to embodiments includes a display panel 101, a plurality of circuit films 103, a first heat dissipation member 120, and a second heat dissipation member 130. The plurality of circuit films 103 are disposed on the display panel 101, extending in an edge-to-edge direction to be spaced apart from each other. The term edge-to-edge direction used herein means a direction extending from one edge of the display panel to the opposite edge in one embodiment. Each circuit film 103 has one side connected to an edge of the display panel 101 and the other side connected to a printed circuit board (PCB) 105 such that the PCB 105 is disposed on a rear surface of the display panel 101. The first heat dissipation member 120 has a hollow structure with an internal space S therein and coupled to the rear surface of the display panel 101. The second heat dissipation member 130 is coupled to a rear surface of the first heat dissipation member 120 and on which the PCB 105 is disposed.

Referring first to FIGS. 1 and 2, the circuit films 103 are disposed on the display panel 101 to extend in the edge-to-edge direction, such that the circuit films 103 are spaced apart from each other. Each circuit film 103 has one side electrically connected to an edge of the display panel 101 and the other side electrically connected to the PCB 105. Here, the circuit film 103 is bent so as to be disposed to be parallel to the rear surface of the display panel 101 on which the PCB 105 is disposed in a position spaced apart from the edge of the display panel 101.

Herein, embodiments may be applied, irrespective of whether the display panel 101 is a liquid crystal display (LCD) panel or a light-emitting display panel.

That is, in a case in which the display panel 101 is a LCD panel, the display panel 101 may include a backlight unit illuminating the LCD panel, a bottom polarizer attached to a bottom substrate, and a top polarizer attached to a front surface of a top substrate. The specific configuration of each of the bottom substrate and the top substrate may be one of a variety of configurations well-known in the art, depending on the driving mode of the LCD panel, such as a twisted nematic (TN) mode, a vertical alignment (VA) mode, an in-plane switching mode, and a fringe field switching (FFS) mode.

In addition, in a case in which the display panel 101 is a light-emitting display panel, the display panel 101 may include a bottom substrate in which a plurality of emission cells are arrayed in areas defined by gate lines, data lines, and power (VDD) lines, respectively, and a top substrate facing and attached to the bottom substrate.

In addition, each of the plurality of emission cells provided in the bottom substrate may include at least one switching transistor connected to a corresponding gate line among the plurality of gate lines and a corresponding data line among the plurality of data lines, at least one driving transistor connected to the switching transistor and a power (VDD) line among the plurality of power lines, and a light-emitting element (e.g. an OLED) emitting light in response to a current controlled by switching of the driving transistor. The top substrate may include a moisture absorber or the like, to protect the light-emitting elements from moisture or oxygen in the ambient air.

Here, the top substrate may further include light-emitting elements connected to the driving transistors. In this case, the light-emitting elements may be omitted from the bottom substrate.

According to embodiments, in the drawings, the light-emitting display panel 101 is illustrated by way of example Since the light-emitting display panel 101 has a self-emitting structure, a backlight unit illuminating the panel is not illustrated. Hereinafter, the display panel 101 will be described as being a light-emitting display panel by way of example.

Since an organic compound contained in a pixel array of the light-emitting display panel 101 may be deteriorated when exposed to moisture or oxygen, an encapsulation member 107 may be bonded to the rear surface of the display panel 101 to seal the pixel array in order to prevent the deterioration of pixels.

Herein, the encapsulation member 107 may be a metal substrate or a glass substrate, and a polarizer film (not shown) may be attached to the front surface of the display panel 101 by adhesion or bonding.

The first heat dissipation member 120 may be attached to the rear surface of the encapsulation member 107.

In addition, a side seal member 101a may be provided on the side surface of the display panel 101 to prevent light leakage, in which case light emitted by the pixel array may leak through the side surface of the display panel 101.

Here, the side seal member 101a may be made of a polymer material to which a black pigment is added. The side seal member 101a may absorb light emitted from the pixel array, so that light does not leak through the side surface of the display panel 101.

In addition, the plurality of flexible circuit films 103 are attached to the display panel 101 and the PCB 105 using fixing members 101b, such as a resin, by a tape-automated bonding (TAB) process. The flexible circuit films 103 may be tape carrier packages (TCPs) or chip-on-flexible boards or chip-on-films (COFs).

Accordingly, the display panel 101 is electrically connected or coupled to the PCB 105 via the plurality of flexible circuit films 103. The PCB 105 is electrically connected to the plurality of flexible circuit films 103, through which a variety of signals are provided to the display panel 101 to display images.

The PCB 105 is electrically connected to the plurality of circuit films 103, through which a variety of signals are provided to the display panel 101 to display images. The driver ICs 103a and the like, for controlling the operation of the display panel 101, are mounted on the circuit films 103.

In addition, the first heat dissipation member 120 and the second heat dissipation member 130 may be provided on the rear surface of the display panel 101 so that heat generated by the display panel 101, the circuit film 103, the driver IC 103a surface-mounted on the circuit film 103, the PCB 105, and internal components, such as a level shifter IC 105a, mounted on the PCB can be dissipated.

The first heat dissipation member 120 coupled to the rear surface of the display panel 101 has a hollow structure with an internal space S being defined therein, so that heat generated by the display panel 101 and the driver IC 103a mounted on the circuit film 103, is dissipated by means of a convective process of air through the internal space S.

The first heat dissipation member 120 may be made of a metal, such as aluminum, an aluminum alloy, or stainless steel, or a plastic, having high thermal conductivity.

In addition, the rear surface of the display panel 101 and the front surface of the first heat dissipation member 120 may be attached to each other by means of an adhesive member 140a, so that the first heat dissipation member can perform heat dissipation in a fixed position without being detached from the rear surface of the display panel 101.

Here, the adhesive member 140a may be adhesive insulating tape, adhesive thermal conductive tape, or the like, formed of a flexible material having a predetermined thickness. At least one of the adhesive materials may include a thermal interface material (TIM).

The first heat dissipation member 120 has a substantially flat rectangular parallelepiped structure, similar to the display panel 101. A front plate 121 and a rear plate 123, as well as at least one partition wall 125 connecting the front plate 121 and the rear plate 123, are provided. This structure has a predetermined level of rigidity to reinforce the first heat dissipation member, so that even if an external load is applied to the display panel 101, the first heat dissipation member can perform a heat dissipation function while supporting the display panel 101 without being deformed.

In addition, in the first heat dissipation member 120, the internal space S defined by the front plate 121, the rear plate 123, and the partition wall 125 is open through the upper side of the first heat dissipation member 120, i.e. toward the upper side of the display panel 101, so that heated air in the internal space S can be easily circulated upwardly and heat exchanged with external air.

However, this is merely provided for easy circulation of air and easy heat exchange with external air, so the direction of opening is not necessarily limited to the upper direction. Thus, it is noted that the first heat dissipation member 120 may employ any other direction toward which the internal space is open according to embodiments.

In the meantime, a bottom cover 110 is provided on the rear surface of the display panel 101 so that the display panel 101, the first heat dissipation member 120, and the second heat dissipation member 130 are enclosed therein.

Here, the bottom cover 110 includes a side support portion 111 disposed on the lateral side of the display panel 101, and a rear support portion 115 disposed on the rear surface of the display panel 101. The circuit film 103 is disposed on the front surface of the rear support portion 115.

A protrusion 127 protruding toward the bottom cover 110 is provided on the rear plate of the first heat dissipation member 120 at a lower end thereof. The rear support portion 115 is provided on the front surface thereof with a corresponding stepped portion 115a protruding toward the protrusion 127 of the first heat dissipation member 120.

The driver IC 103a of the circuit film 103 is disposed and supported between the protrusion 127 of the first heat dissipation member 120 and the stepped portion 115a of the bottom cover 110, so that heat generated by the driver IC 103a can be dissipated through both the bottom cover 110 and the first heat dissipation member 120, while the circuit film 103 and the driver IC 103a are supported in a precise position.

The second heat dissipation member 130 includes a first support 131 disposed on the rear surface of the first heat dissipation member 120, and a second support 133 bent on an upper side of the first support 131, so that the PCB 105 is inserted and supported in the bent portion of the second support 133.

Here, the second heat dissipation member 130 may be made of a metal, such as aluminum, an aluminum alloy, or stainless steel, or a plastic, having high thermal conductivity.

In addition, the rear surface of the rear plate 123 of the first heat dissipation member 120 and the front surface of the first support 131 may be attached to each other by means of an adhesive member 140b so that the first support 131 can perform heat dissipation in a fixed position without detachment from the rear surface of the first heat dissipation member 120.

Here, the adhesive member 140b may be adhesive insulating tape, adhesive thermal conductive tape, or the like, formed of a flexible material having a predetermined thickness. At least one of the adhesive materials may include a thermal interface material (TIM).

In addition, the second support 133 is provided with a stepped support portion 135 which is bent on an end side thereof to support the level shifter IC 105a of the PCB 105, so that the stepped support portion 135 can securely fix the PCB 105 in position while dissipating heat generated by the level shifter IC 105a through the second support 133.

The second support 133 and the stepped support portion 135 firmly support the PCB 105 therearound, while elastically engaging the same.

That is, as illustrated in FIG. 7, when the PCB 105 is detached (as illustrated in the left drawing), the second support 133 and the stepped support portion 135 are provided in a state of being bent toward the first support 131. When the PCB 105 is in engagement therewith (as illustrated in the right drawing), the second support 133 and the stepped support portion 135 are elastically deformed outward so that the second support 133 and the stepped support portion 135 support the PCB 105 with elastic restorative force.

In addition, as illustrated in FIG. 6, a support edge protrusion 137 may be provided on the rear surface of the first support 131 at a lower edge thereof, such that the support edge protrusion is disposed between the circuit films 103, to support the lower side of the PCB 105. When the display panel 101 is vertically mounted, the support edge protrusion 137 supports the lower side of the PCB 105 so that the upper side of the PCB 105 is not disengaged from the second support 133.

On the other hand, the first heat dissipation member 120 is provided on the rear surface thereof with at least one elastic protrusion 129 protruding toward the second heat dissipation member 130, and the second heat dissipation member 130 is provided with an insertion hole 139 into which the elastic protrusion 129 is elastically deformed and inserted. Thus, the first heat dissipation member 120 and the second heat dissipation member 130 can be coupled together by means of engagement between the elastic protrusion and the insertion hole.

While the elastic protrusions 129 are provided on the rear surface of the first heat dissipation member 120, one or more elastic protrusions 129 may be disposed on a corner of the first heat dissipation member 120. Four elastic protrusions 129 are illustrated as being provided in four corners of the first heat dissipation member 120, respectively.

Each of the elastic protrusions 129 has a connecting portion 139a connected to the rear surface of the first heat dissipating member 120 and supported by the inner surface of the insertion hole 139, and an elastic support portion 139b extending horizontally from an end portion of the connecting portion 139a such that a width thereof is greater than a diameter of the insertion hole 139, so that the elastic support portion is supported by the rear surface of the second heat dissipation member 130.

When the elastic protrusion 129 is fitted into the insertion hole 139, the elastic support portion 139b passes through the insertion hole in an elastically contracted state, and then elastically expands and is supported by the rear surface of the first support 131, so that the elastic protrusion 129 is not detached from the first support after the elastic support portion 139b completely passes out of the insertion hole.

In addition, for easy elastic deformation of the elastic protrusion 129, the elastic support portion 139b, or both the elastic support portion 139b and the connecting portion 139a may be divided into two or more separate sections with gaps therebetween so that the separate sections can be elastically deformed between the gaps. In FIG. 5, the connecting portion 139a and the elastic support portion 139b are formed in two separate sections, respectively.

Alternatively, as illustrated in FIG. 8, the first heat dissipation member 120 and the second heat dissipation member 130 may be coupled together by means of a fastening member 150 such as a screw. In this case, the first heat dissipation member 120 and the second heat dissipation member 130 may be provided with fastening holes 130a, respectively, through which the fastening member 150 is fastened.

In the meantime, as illustrated in FIG. 9, an extended support portion 131a may be provided on the lower side of the first support 131 such that the extended support portion 131a extends in the direction of the side support portion 111 of the bottom cover 110, i.e. in the longitudinal direction of the first support 131. In addition, the driver IC 103a of the circuit film 103 may be supported between the stepped portion 115a of the bottom cover 110 and the extended support portion 131a.

In this case, heat generated by the driver IC 103a can be dissipated through both the second heat dissipation member 130 and the bottom cover 110, and the circuit film 103 and the driver IC 103a can be supported in a precise position.

In addition, a heat dissipation pad 160 may be disposed between the driver IC 103a of the circuit film 103 and the extended support portion 131a. The heat dissipation pad 160 may be adhesive insulating tape, adhesive thermal conductive tape, or the like, formed of a flexible material having a predetermined thickness. At least one of the adhesive materials may include a thermal interface material (TIM).

In this way, the provision of the first heat dissipation member 120 and the second heat dissipation member 130 can significantly reduce heat transmitted to the display panel 101. FIG. 10 illustrates a variation in temperature of the display panel in case (TEST 1) of the absence of the first and second heat dissipation members 120 and 130 and in case (TEST 2) of the existence of the first and second heat dissipation members 120 and 130.

As a result of repeated tests, in the case (TEST 1) of the absence of the first and second heat dissipation members 120 and 130, maximum temperature, minimum temperature, and average temperature of the front surface of the display panel were 52.7° C., 37.0° C., and 42.2° C., respectively.

However, in the case (TEST 2) of the existence of the first and second heat dissipation members 120 and 130, maximum temperature, minimum temperature, and average temperature of the front surface of the display panel were 43.3° C., 32.0° C., and 34.8° C., respectively. Thus, a noticeable temperature drop could be appreciated.

That is, it can be confirmed that heat dissipation is sufficiently performed through the first heat radiation member 120 and the second heat radiation member 130 by decreasing the maximum temperature, the minimum temperature, and the average temperature by 9.4° C., 5.0° C., and 7.4° C., respectively.

According to embodiments, the display device has an advantageous structure able to facilitate detachment and attachment of PCBs during assembly and disassembly while firmly supporting the PCBs and circuit films.

According to embodiments, the display device also has an advantage advantageous structure able to protect circuit films, PCBs, and the like connected to the display panel, and to improve heat dissipation performance for dissipating heat from the driver ICs and the like, thereby improving the image quality and durability of the display panel.

Although all of the components constituting embodiments have been described as being combined together or as operating in concert with each other, the present disclosure is not necessarily limited thereto. One of more of components of the present disclosure may be selectively and operatively combined within the scope of the object of the present disclosure.

It will be understood that the terms "comprise," "include," "have," and any variations thereof used herein are intended to cover non-exclusive inclusions unless explicitly described to the contrary. Unless otherwise specified, all terms including technical and scientific terms used herein have the same meaning as commonly understood by a person having ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

The foregoing descriptions and the accompanying drawings have been presented in order to explain certain principles of the present disclosure by way of example. A person having ordinary skill in the art to which the present disclosure relates could make various modifications and variations without departing from the principle of the present disclosure. The foregoing embodiments disclosed herein shall be interpreted as being illustrative, while not being limitative, of the principle and scope of the present disclosure. It should be understood that the scope of the present disclosure shall be defined by the appended Claims and all of their equivalents fall within the scope of the present disclosure.

What is claimed is:

1. A display device comprising:
    a display panel;
    a plurality of circuit films disposed on both sides of the display panel, extending in an edge-to-edge direction to be spaced apart from each other, wherein each of the plurality of circuit films has one side connected to an edge of the display panel and another side connected to a printed circuit board such that the printed circuit board is disposed on a rear surface of the display panel;
    a first heat dissipation member having a hollow structure with an internal space therein and coupled to the rear surface of the display panel; and
    a second heat dissipation member coupled to a rear surface of the first heat dissipation member and on which the printed circuit board is disposed.

2. The display device according to claim 1, wherein the rear surface of the display panel and a front surface of the first heat dissipation member are attached to each other by means of an adhesive member.

3. The display device according to claim 1, wherein the first heat dissipation member is provided with a front plate, a rear plate, and at least one partition wall to connect the front plate and the rear plate of the first heat dissipation member.

4. The display device according to claim 3, wherein in the first heat dissipation member, the internal space is defined by the front plate, the rear plate, and the partition wall such that the internal space is open through an upper side of the first heat dissipation member.

5. The display device according to claim 1, further comprising:
a bottom cover, wherein the bottom cover includes a side support portion disposed on a lateral side of the display panel, and a rear support portion disposed on the rear surface of the display panel, wherein the circuit film is disposed on a front surface of the rear support portion.

6. The display device according to claim 5, wherein a protrusion is provided on a lower side of the first heat dissipation member such that the protrusion protrudes toward the bottom cover, and the rear support portion is provided with a corresponding stepped portion protruding toward the first heat dissipation member at a position corresponding to the protrusion, wherein a driver integrated circuit of the circuit film is disposed and supported between the protrusion and the stepped portion.

7. The display device according to claim 5, wherein the second heat dissipation member includes a first support disposed on the rear surface of the first heat dissipation member, and a second support bent on an upper side of the first support so that the printed circuit board is inserted into the bent portion of the second support.

8. The display device according to claim 7, wherein the rear surface of the first heat dissipation member and a front surface of the first support are attached to each other by means of an adhesive member.

9. The display device according to claim 7, wherein the second support is provided with a stepped support portion which is bent on an end side thereof to support a level shifter integrated circuit of the printed circuit board.

10. The display device according to claim 7, wherein a support edge protrusion is provided on a lower side of the first support such that the support edge protrusion is disposed between the circuit films to support a lower side of the printed circuit board.

11. The display device according to claim 1, wherein the first heat dissipation member is provided on the rear surface thereof with at least one elastic protrusion protruding toward the second heat dissipation member, and the second heat dissipation member is provided with an insertion hole into which the elastic protrusion is elastically deformed and inserted.

12. The display device according to claim 11, wherein the elastic protrusion includes a connecting portion connected to the rear surface of the first heat dissipating member and supported by an inner surface of the insertion hole, and an elastic support portion extending horizontally from an end portion of the connecting portion such that a width thereof is greater than a diameter of the insertion hole, such that the elastic support portion is supported by a rear surface of the second heat dissipation member.

13. The display device according to claim 1, wherein the first heat dissipation member and the second heat dissipation member are coupled together by means of a fastening member.

14. The display device according to claim 7, wherein an extended support portion is provided on a lower side of the first support such that the extended support portion extends in a direction of the side support portion, wherein a driver integrated circuit of the circuit film is supported between a stepped portion of the bottom cover and the extended support portion.

15. The display device according to claim 14, wherein a heat dissipation pad is disposed between the driver integrated circuit of the circuit film and the extended support portion.

* * * * *